(12) United States Patent
Kersch et al.

(10) Patent No.: US 6,649,521 B2
(45) Date of Patent: Nov. 18, 2003

(54) METHOD FOR DETERMINING THE RELEVANT ION AND PARTICLE FLOWS IN I-PVD PROCESSES

(75) Inventors: Alfred Kersch, Putzbrunn (DE); Alexander Ruf, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/208,415

(22) Filed: Jul. 29, 2002

(65) Prior Publication Data

US 2003/0029727 A1 Feb. 13, 2003

(30) Foreign Application Priority Data

Jul. 27, 2001 (DE) .......................................... 101 36 854

(51) Int. Cl.$^7$ ........................... H01L 21/44; G06E 19/00
(52) U.S. Cl. ....................... 438/676; 438/679; 438/685; 700/121
(58) Field of Search .................. 438/771, 776, 438/685, 679, 676; 700/121

(56) References Cited

U.S. PATENT DOCUMENTS 6,151,532 A * 11/2000 Barone et al.
6,391,776 B2 * 5/2002 Hashim et al.
2002/0193979 A1 * 12/2002 Paterson

FOREIGN PATENT DOCUMENTS

DE        42 19 692 C1       7/1993

OTHER PUBLICATIONS

Meng Chen's "Simulation of Boron Nitride Sputtering Process and Its Comparison with Experimental Data", IEEE, 1998, pp. 1713–1717.*

K. Fujino: "Step–Coverage Simulation for Tetraethoxysilane and Ozone Atmospheric Pressure Chemical Vapor Deposition", *J. Electrochem. Soc.*, vol. 140, No. 8, Aug. 1993, pp. 2309–2312.

Cynthia L. Pillote et al.: "Characterization of phosphosilicate glass films obtained using plasma–enhanced chemical vapor deposition from tetraethylorthosilicate and trimethylphosphite", *Thin Solid Films*, vol. 236, 1993, pp. 287–293.

T.S. Cale et al.: Kinetics and conformality of TiN films from TDEAT and ammonia *Thin Solid Films*, vol. 236, 1993, pp. 294–300.

B.R. Rogers et al.: "Spatial composition variation in sputtered Ti–W films" *Thin Solid Films*, vol. 236, 1993, pp. 334–340.

Hung Liao et al.: "Three–dimensional simulation of an isolated trench refill process", *Thin Solid Films*, vol. 236, 1993, pp. 352–358.

S. Hamaguchi et al.: "Simulations of trench–filling profiles under ionized magnetron sputter metal deposition", *J. Vac. Sci. Technol.*, vol. B 13 (2), Mar./Apr. 1995, pp. 183–191.

C. A. Nichols et al.: "Ionized physical vapor deposition of Cu for high aspect ratio damascene trench fill applications", *J. Vac. Sci. Technol.* vol. B 14 (5), Sep. /Oct. 1995, pp. 3270–3275.

* cited by examiner

Primary Examiner—Ha Tran Nguyen
(74) Attorney, Agent, or Firm—Laurence A. Greenberg; Werner H. Stemer; Ralph E. Locher

(57) ABSTRACT

A method for determining relevant deposition parameters in i-PVD processes, includes, first calculating the reaction rates for desired reagents of the gas plasma and of a metal and/or metal compound to be deposited, then simulating the edge coverage of a predetermined structure with the deposited metal based upon the calculated reaction rates with systematic variation of the relevant deposition parameters, and compiling variant tables therefrom. By comparing an experimental verification of the simulated edge coverage by imaging the edge coverage of the metal layer deposited over the determined structure, e.g., using a TEM cross-section, with the simulated deposition parameters for the edge coverages that have been recorded in the variant table, it is possible to read the deposition parameters that are of relevance to the process from the variant table.

16 Claims, 3 Drawing Sheets

DETAIL II

US 6,649,521 B2

METHOD FOR DETERMINING THE RELEVANT ION AND PARTICLE FLOWS IN I-PVD PROCESSES

BACKGROUND OF THE INVENTION

FIELD OF THE INVENTION

The invention relates to a method for determining relevant deposition parameters in i-PVD processes, in which metal atoms and metal ions are transported in a gas plasma, under the influence of electromagnetic fields, to a substrate and are deposited thereon.

The main difficulty in the PVD processes remains that of ensuring sufficiently conformal deposition of very thin films that are only a few nanometers thick in vias and trenches with an increasing aspect ratio. Such a problem is combated by the development of ionized PVD processes ("i-PVD"). Such processes promote the steep angle of incidence of the particles, which generally are of metal or metal compounds, on a substrate of a wafer. In the i-PVD processes, the transport of metal ions is optimized by the generation of a higher plasma density in combination with a greater ionization rate through the action of electromagnetic fields. The plasma used is typically an $Ar^+$ plasma. In the text that follows, $Ar^+$ is used as a representative of carrier gases in the plasma. The metal ions are produced by ionization of metal atoms, in the case of hollow cathode magnetron (HCP) or self-ionized plasma (SIP) within a special magnetron, or in the case of ionized metal plasma (IMP) below the target, by an inductively operated plasma. Moreover, the transport of the metal ions to the substrate and the energy distribution thereof is influenced by an alternating voltage applied to the substrate, which is referred to as the substrate bias. Examples of relevant metals or metal compounds are Ti, TiN, Al, Ta, TaN, Cu, W, WN, Ni, Co, Fe, etc.

Optimization of such a novel i-PVD process has the purpose of ensuring the required topological properties, such as conformity, base and side wall coverage, the morphological properties, such as density, grain size distribution, texture, and the electrical properties, such as the conductivity of the ultra thin, multifunctional layers that are to be deposited under the more stringent geometric requirements of future technologies.

To optimize the procedure for certain processes for producing identical process conditions in reactors made by different manufacturers and to allow the process window to be evaluated at all, it is a central objective to determine the particle flows $f(Ar^+)$ of $Ar^+$ ions, $f(M^+)$ of $M^+$ ions and $f(M)$ of neutral metal (M). If there is an absence of or a low substrate bias voltage ($U_{(bias)}$), a different ratio $i=f(M^+)/f(M)$ results in different degrees of base coverage, while in the case of a significant substrate bias voltage (with ion energies greater than the threshold energy required for re-sputtering), in addition to the ratio i, the flow of energy ions $r=f(Ar^+)/(f(Ar^+)+f(M^+)+f(M))$ leads to effects such as re-sputtering, which increases the side wall coverage, beveling (i.e., preferential re-sputtering at edges), changed microstructure, and changed electrical properties. Therefore, the substrate bias voltage $U_{(bias)}$ is a further important variable.

Because in the case of a low substrate bias voltage the deposition rate works out as $d \approx f(M^+)+f(M)$, the relevant process parameters that determine the deposition properties in question are d, i, r, and $U_{(bias)}$. In such a context, the angular distribution of the incident particles plays a minor role because, in the i-PVD processes, unlike in conventional PVD processes, the neutral particles are virtually isotropic and the ionized particles have a strong forward directionality. The ionized particles have an opening angle that changes only slightly with the substrate bias voltage $U_{(bias)}$.

The substrate bias voltage $U_{(bias)}$ can, in principle, be determined by an electrical measuring configuration by measuring the temporal mean of the substrate potential against the plasma potential. In practice, however, such a possibility does not exist on commercially available i-PVD installations. Therefore, a different determination method is desirable for the substrate bias voltage.

While in the absence of or with a low substrate bias voltage, the deposition rate is given by $f(M^+)+f(M)$, the determination of the abovementioned ratio i and of the flow r of the energy ions requires separation of the ionized flows of the total particle flow and a distinction between $f(Ar^+)$ and $f(M^+)$, for example, based upon mass. This can be achieved with a mass spectrometer that is directly connected to the i-PVD chamber. However, such a method cannot be employed in a manufacturing environment. Therefore, hitherto, in practice rapid and accurate determination of the relevant process parameters has not been possible.

Accordingly, there is currently no suitable way of providing an installation with a type of control configuration on the basis of which it can decide whether or not relevant process parameters are moving out of the desired target corridor.

SUMMARY OF THE INVENTION

It is accordingly an object of the invention to provide a method for determining the relevant ion and particle flows in i-pvd processes that overcomes the hereinafore-mentioned disadvantages of the heretofore-known devices and methods of this general type and that allows rapid and accurate determination of the deposition parameters that are, in this case, of relevance, including in manufacturing, without expensive refitting or upgrading of commercial i-PVD installations.

With the foregoing and other objects in view, there is provided, in accordance with the invention, a method for determining relevant deposition parameters in i-PVD processes, including the steps of transporting metal atoms and metal ions in a gas plasma, under an influence of electromagnetic fields, to a substrate and depositing the metal atoms and the metal ions on the substrate by (A) calculating reaction rates for desired reagents of the gas plasma and of a material to be deposited, the material selected from at least one of the group consisting of a metal and a metal compound, (B) simulating an edge coverage of a predetermined structure with the deposited material based upon the reaction rates calculated in step (A) with simultaneous systematic variation of the relevant deposition parameters, (C) compiling, from results of the simulation of step (B), variant tables for the relevant deposition parameters for the predetermined structure, (D) executing an i-PVD process in a selected gas plasma and using a selected material over the predetermined structure, (E) experimentally verifying the simulated edge coverage for the product produced in step (D) with an imaging process, and (F) determining the relevant deposition parameters by comparing the experimental verification produced in step (E) with the variant tables compiled in step (C).

The invention includes a method by which the particle flows d, i, r, and, if appropriate, also the substrate bias voltage $U_{(bias)}$, can be read from a single experimental verification, obtained by an imaging process, of a predetermined structure formed by i-PVD. Such a method allows the important process parameters to be determined without altering the reactor and with little outlay.

In recent times, it has become possible to calculate the reaction rates of $Ar^+$, $M^+$, and M on the substrate that is to be metallized with sufficient accuracy using molecular dynamics methods (for copper cf. D. G. Coronell et al., Applied Physics Letters No. 73 (1998), 3860). The inventors themselves have used such molecular dynamics methods to calculate the reaction rates for Cu, Al, Ti, and Ta. Given knowledge of these reaction rates, it is possible, for various assumptions about the values of d, i, r, and $U_{(bias)}$, to simulate the edge coverage of a contact hole or a similar structure (cf. U. Hansen et al., Physical Review, B 62 (2000) 2869). It has been found that the edge coverage of such a structure has characteristic differences for all these variants. Conversely, if the edge coverages have been calculated for all these variants and are in the form of a variant table, the parameter values can be worked out from the comparison with an experimental verification obtained by an imaging process, e.g., a TEM cross-section of a deposition that has taken place.

In accordance with another mode of the invention, an imaging process that supplies the experimental verification of the simulated edge coverage may, for example, be a cross-section, produced by TEM through the predetermined structure. Such a cross-section can also be produced by an SEM image.

In the event of an absence of or a low substrate bias voltage, the relevant deposition parameters include at least the deposition rate $d \approx f(M^+)+f(M)$ and a ratio $i=f(M^+)/f(M)$ of the particle flow of metal ions to the particle flow of the neutral metal atoms.

On the other hand, in the case of a significant substrate bias, the relevant deposition parameters include at least the deposition rate d, the above-mentioned ratio i. and the flow $r=f(Ar^+)/(f(Ar^+)+f(M^+)+f(M))$ of energy ions. Furthermore, the relevant deposition parameters may also include the substrate bias voltage $U_{(bias)}$.

In accordance with a further mode of the invention, the deposited metal is Ti and the gas plasma is an Ar plasma.

In accordance with an added mode of the invention, the predetermined structure is an axially symmetrical overhang structure of a contact hole.

Moreover, an application of the method according to the invention includes a control configuration associated with an installation, on the basis of which the installation is able to decide whether or not relevant process parameters are moving out of the desired target corridor.

An exemplary embodiment of the method according to the invention is described below with reference to the drawing for an i-PVD process during the deposition of titanium on silicon oxide. The structure selected was an axially symmetrical overhang structure of a contact hole. However, the results are not restricted to such a structure, although the parameters can be read particularly accurately with such an overhang structure. Also, the method according to the invention is in no way restricted to an i-PVD process for depositing titanium on silicon oxide. It can be applied to any type of i-PVD for depositing metals or metal compounds.

Other features that are considered as characteristic for the invention are set forth in the appended claims.

Although the invention is illustrated and described herein as embodied in a method for determining the relevant ion and particle flows in i-pvd processes, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
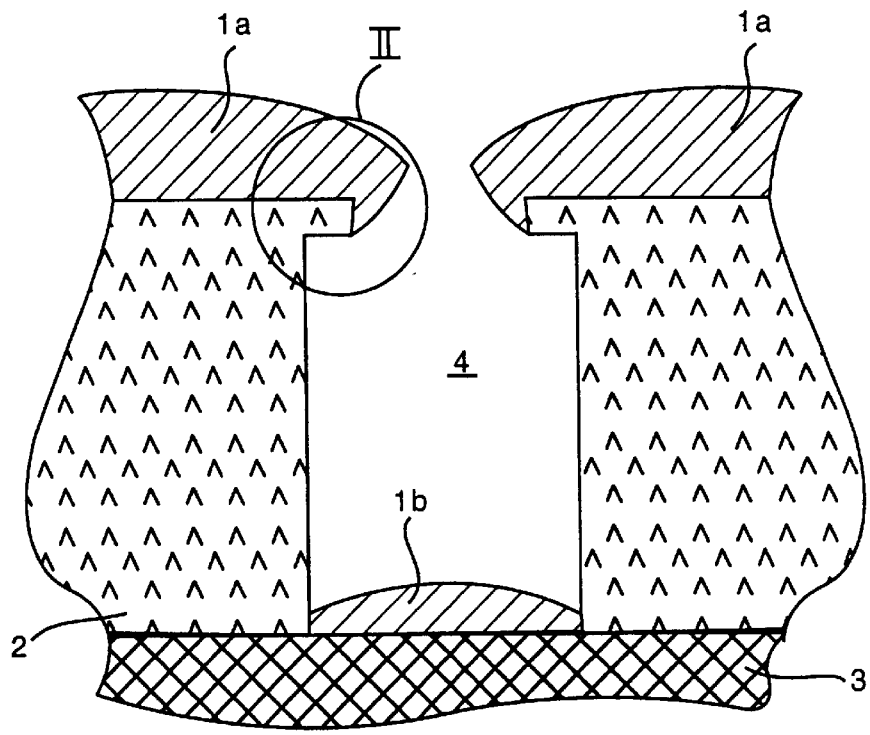
FIG. 1 is a fragmentary, diagrammatic, cross-sectional view of a cross-section, taken by TEM, through an axially symmetrical overhang structure of a contact hole above which a titanium layer has been deposited according to the invention.
Figure 2:
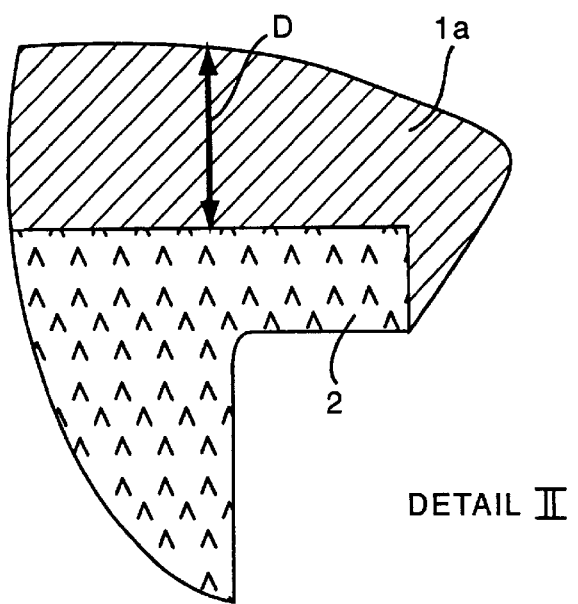
FIG. 2 is an fragmentary, enlarged, diagrammatic, cross-sectional view of the edge region within the area enclosed by circle II in FIG. 1.

Referring now to the figures of the drawings in detail and first, particularly to FIG. 1 thereof, there is shown a diagrammatic depiction of an enlarged TEM cross-section through an axially symmetrical overhang structure, i.e., through a contact hole 4 in an SiOx substrate or layer 2, above which a titanium layer 1a, 1b has been deposited using an i-PVD process. Beneath the SiOx layer 2 there is a further layer 3, for example, a further metallization level. FIG. 1 shows that a small part 1b of the deposited titanium has also been deposited at the base of the contact hole 4. The detailed view II in FIG. 2 shows that the edge-covering titanium layer 1a has been deposited with a particular thickness over the edge of the overhang structure, where it has a thickness D of approximately 300 nm. Such a considerable thickness D was selected to achieve high measurement accuracy.

It should be noted that the diagrammatically illustrated structure in FIGS. 1 and 2 is an image for an experimental verification of the simulated edge coverage and does not replace the true TEM image. This TEM cross-sectional image is merely diagrammatically indicated in these figures. Furthermore, the structure illustrated is not the only possible structure, and, consequently, the results are not restricted to such a structure. However, the relevant process parameters can be read particularly accurately with such a structure. The scale of FIG. 2 is such that 1 cm covers approximately 100 nm. What is not shown in FIGS. 1 and 2 is that the contact hole 4 may be filled, for example, with a tungsten plug and the titanium layer 1a may be covered with further (insulating) layers. The tungsten plug would then produce the electrical connection between the deposited titanium layer 1a and the metallization level 3 lying below the SiOx layer 2.

Figure 3:
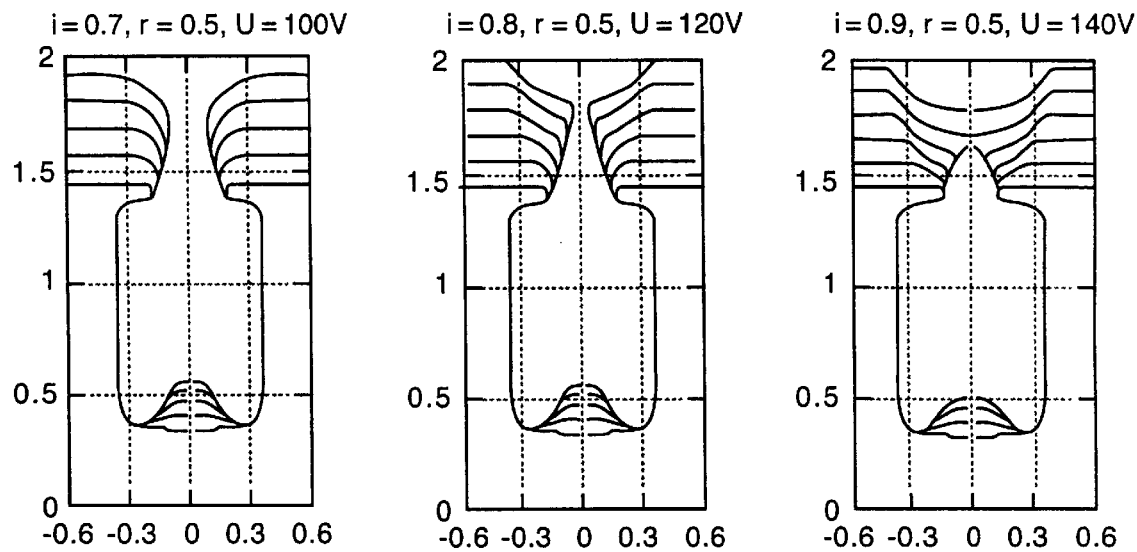
FIG. 3A is a set of excerpts from a variant table for different values of i, r, and $U_{(bias)}$ according to the invention.
FIG. 3B is a set of excerpts from a variant table for values of i, r, and $U_{(bias)}$ different from FIG. 3A.
FIG. 3C is a set of excerpts from a variant table for values of i, r, and $U_{(bias)}$ different from FIG. 3A.
Figure 3:
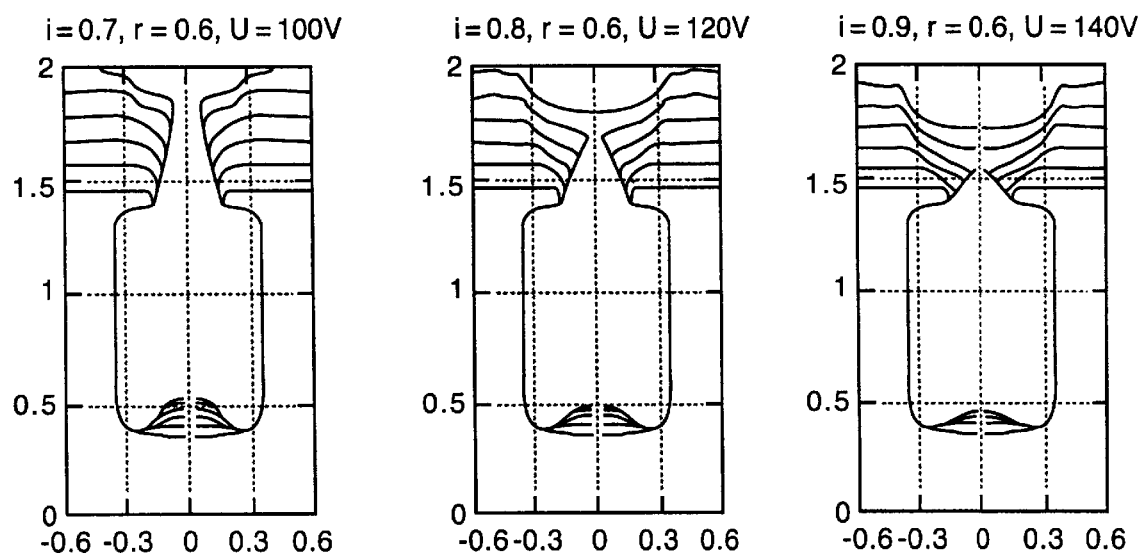
Figure 3:
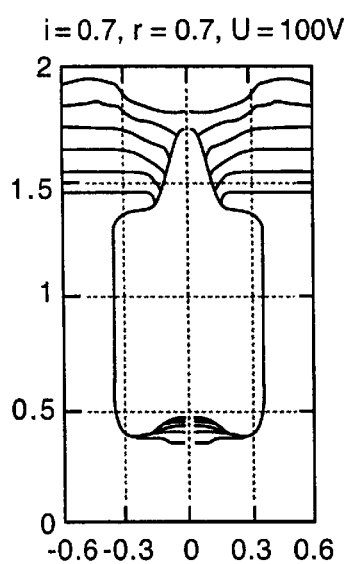
Figure 3:
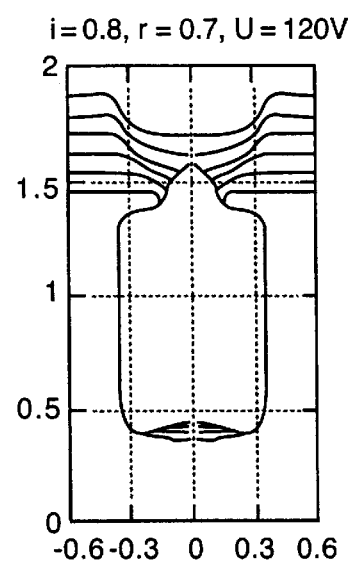
Figure 3:
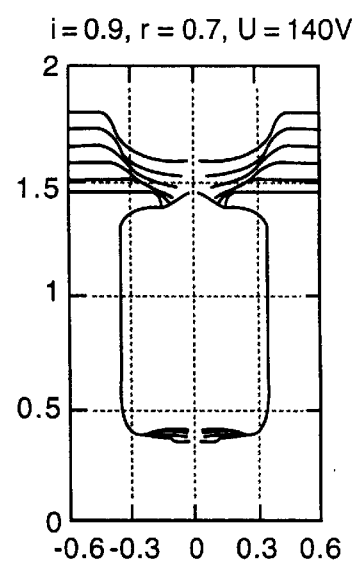

FIGS. 3A, 3B, and 3C show just parts of a variant table calculated by simulation for the structure shown in FIGS. 1 and 2 and for Ti as the deposited metal.

For example, FIG. 3A shows only three different edge coverages, respectively, for a constant r=0.5; a variable i=0.7, 0.8, 0.9, and a variable $U_{(bias)}$=100 volts, 120 volts, and 140 volts.

FIG. 3B shows three different edge coverages, respectively, for a constant r=0.6, a variable i=0.7, 0.8, 0.9, and a variable $U_{(bias)}$=100 volts, 120 volts, and 140 volts.

FIG. 3C shows three edge coverages, respectively, for a constant r=0.7, a variable i=0.7, 0.8, 0.9, and a variable $U_{(bias)}$=100 volts, 120 volts, and 140 volts.

The units used for the length values plotted on the abscissa and ordinate are micrometers.

Comparing the TEM cross-sectional image that is diagrammatically portrayed in FIG. 1 with the variant table results in parameter values of i=0.8, r=0.6, and $U_{(bias)}$=120 volts for such a process (cf. FIG. 3B, center illustration).

It should be noted that the diagrammatic illustration presented in FIGS. 1 and 2 cannot completely represent the optical details of a TEM cross-sectional image. However, in the context of the present application, the TEM cross-sectional images on which FIGS. 1 and 2 were based has not been reproduced in photographic form for the simple reason of the difficulty of making copies of such.

The above description demonstrates that the parameters d, i, r, and, if appropriate, also $U_{(bias)}$ that are of importance for the deposition can all be read simultaneously from a TEM cross-section if the variant table described above has been compiled beforehand. The calibration of the variant table makes it possible, in a simple and rapid manner and without major costs, to determine the process windows of an installation and to store them for a desired application.

As an alternative to a TEM cross-section, which is merely given here by way of example of an imaging process that supplies experimental verification of the simulated edge coverage, it is also possible to use an SEM cross-sectional image.

The above description also makes it clear that a possible application of the methods according to the invention lies in providing an installation with a control configuration, on the basis of which it can decide whether or not relevant process parameters are moving or have moved out of the desired target corridor.

We claim:

1. A method for determining relevant deposition parameters in i-PVD processes, which comprises:
   transporting metal atoms and metal ions in a gas plasma, under an influence of electromagnetic fields, to a substrate and depositing the metal atoms and the metal ions on the substrate by:
   (A) calculating reaction rates for desired reagents of the gas plasma and of a material to be deposited, the material selected from at least one of the group consisting of a metal and a metal compound;
   (B) simulating an edge coverage of a predetermined structure with the deposited material based upon the reaction rates calculated in step (A) with simultaneous systematic variation of the relevant deposition parameters;
   (C) compiling, from results of the simulation of step (B), variant tables for the relevant deposition parameters for the predetermined structure;
   (D) executing an i-PVD process in a selected gas plasma and using a selected material over the predetermined structure;
   (E) experimentally verifying the simulated edge coverage for the product produced in step (D) with an imaging process; and
   (F) determining the relevant deposition parameters by comparing the experimental verification produced in step (E) with the variant tables compiled in step (C).

2. The method according to claim 1, wherein the relevant deposition parameters, in an absence of a substrate bias voltage, are selected from at least one of the group consisting of:
   a deposition rate; and
   a ratio of a particle flow of the metal ions to a particle flow of a neutral metal.

3. The method according to claim 1, wherein the relevant deposition parameters, with a substantially absent substrate bias voltage, are selected from at least one of the group consisting of:
   a deposition rate; and
   a ratio of a particle flow of the metal ions to a particle flow of a neutral metal.

4. The method according to claim 1, wherein the relevant deposition parameters, with a presence of a substrate bias voltage, are selected from at least one of the group consisting of:
   a deposition rate;
   a ratio of a particle flow of the metal ions to a particle flow of a neutral metal; and
   a flow of energy ions.

5. The method according to claim 1, wherein the relevant deposition parameters, with a presence of a substrate bias voltage, are selected from at least one of the group consisting of:
   a deposition rate;
   a ratio of a particle flow of the metal ions to a particle flow of a neutral metal;
   a flow of energy ions; and
   the substrate bias voltage.

6. The method according to claim 1, wherein the deposited metal is Ti.

7. The method according to claim 1, wherein the gas plasma is an Ar plasma.

8. The method according to claim 1, wherein the selected gas plasma is an Ar plasma.

9. The method according to claim 1, wherein the predetermined structure is an axially symmetrical overhang structure of a contact hole.

10. The method according to claim 1, which further comprises carrying out the verifying step by experimentally verifying the simulated edge coverage for the product produced in step (D) with a TEM-produced cross-sectional image through the predetermined structure.

11. The method according to claim 1, which further comprises carrying out the verifying step by experimentally verifying the simulated edge coverage for the product produced in step (D) with a cross-sectional image, produced by TEM, through the predetermined structure.

12. The method according to claim 1, which further comprises carrying out steps (A) to (F) in a control configuration of a production installation for deciding if the relevant deposition parameters are moving out of a desired target corridor.

13. In i-PVD processes transporting metal atoms and metal ions in a gas plasma, under an influence of electromagnetic fields, to a substrate and depositing the metal atoms and the metal ions on the substrate, a method for determining relevant deposition parameters which comprises:
   (A) calculating reaction rates for desired reagents of the gas plasma and of a material to be deposited, the material selected from at least one of the group consisting of a metal and a metal compound;

(B) simulating an edge coverage of a predetermined structure with the deposited material based upon the reaction rates calculated in step (A) with simultaneous systematic variation of the relevant deposition parameters;

(C) compiling, from results of the simulation of step (B), variant tables for the relevant deposition parameters for the predetermined structure;

(D) executing an i-PVD process in a selected gas plasma and using a selected material over the predetermined structure;

(E) experimentally verifying the simulated edge coverage for the product produced in step (D) with an imaging process; and (F) determining the relevant deposition parameters by comparing the experimental verification produced in step (E) with the variant tables compiled in step (C).

14. A method for determining relevant deposition parameters in i-PVD processes, in which metal atoms and metal ions are transported in a gas plasma, under an influence of electromagnetic fields, to a substrate and deposited thereon, which comprises:

(A) calculating reaction rates for desired reagents of the gas plasma and of a material to be deposited, the material selected from at least one of the group consisting of a metal and a metal compound;

(B) simulating an edge coverage of a predetermined structure with the deposited material based upon the reaction rates calculated in step (A) with simultaneous systematic variation of the relevant deposition parameters;

(C) compiling, from results of the simulation of step (B), variant tables for the relevant deposition parameters for the predetermined structure;

(D) executing an i-PVD process in a selected gas plasma and using a selected material over the predetermined structure;

(E) experimentally verifying the simulated edge coverage for the product produced in step (D) with an imaging process; and (F) determining the relevant deposition parameters by comparing the experimental verification produced in step (E) with the variant tables compiled in step (C).

15. In a control configuration of a production installation executing i-PVD processes, in which metal atoms and metal ions are transported in a gas plasma, under an influence of electromagnetic fields, to a substrate and deposited thereon, a method for deciding if relevant process parameters are moving out of a desired target corridor, which comprises:

(A) calculating reaction rates for desired reagents of the gas plasma and of a material to be deposited, the material selected from at least one of the group consisting of a metal and a metal compound;

(B) simulating an edge coverage of a predetermined structure with the deposited material based upon the reaction rates calculated in step (A) with simultaneous systematic variation of the relevant process parameters;

(C) compiling, from results of the simulation of step (B), variant tables for the relevant process parameters for the predetermined structure;

(D) executing an i-PVD process in a selected gas plasma and using a selected material over the predetermined structure;

(E) experimentally verifying the simulated edge coverage for the product produced in step (D) with an imaging process; and (F) determining the relevant process parameters by comparing the experimental verification produced in step (E) with the variant tables compiled in step (C).

16. A method for deciding if relevant process parameters are moving out of a desired target corridor in a control configuration of a production installation, which comprises:

executing i-PVD processes in the production installation to transport metal atoms and metal ions in a gas plasma, under an influence of electromagnetic fields, to a substrate and to deposit the metal atoms and the metal ions on the substrate by:

(A) calculating reaction rates for desired reagents of the gas plasma and of a material to be deposited, the material selected from at least one of the group consisting of a metal and a metal compound;

(B) simulating an edge coverage of a predetermined structure with the deposited material based upon the reaction rates calculated in step (A) with simultaneous systematic variation of the relevant process parameters;

(C) compiling, from results of the simulation of step (B), variant tables for the relevant process parameters for the predetermined structure;

(D) executing an i-PVD process in a selected gas plasma and using a selected material over the predetermined structure;

(E) experimentally verifying the simulated edge coverage for the product produced in step (D) with an imaging process; and (F) determining the relevant process parameters by comparing the experimental verification produced in step (E) with the variant tables compiled in step (C).

* * * * *